(12) United States Patent
Haga et al.

(10) Patent No.: US 11,940,730 B2
(45) Date of Patent: Mar. 26, 2024

(54) PHOTORESIST COMPOSITIONS AND PATTERN FORMATION METHODS

(71) Applicant: Rohm and Haas Electronic Materials LLC, Marlborough, MA (US)

(72) Inventors: Mitsuru Haga, Niigata (JP); Mingqi Li, Shrewsbury, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 71 days.

(21) Appl. No.: 17/565,019

(22) Filed: Dec. 29, 2021

(65) Prior Publication Data

US 2022/0229366 A1    Jul. 21, 2022

Related U.S. Application Data

(60) Provisional application No. 63/132,686, filed on Dec. 31, 2020.

(51) Int. Cl.
*G03F 7/039* (2006.01)
*G03F 7/004* (2006.01)
(Continued)

(52) U.S. Cl.
CPC .......... *G03F 7/0392* (2013.01); *G03F 7/0045* (2013.01); *G03F 7/20* (2013.01); *G03F 7/38* (2013.01); *G03F 7/40* (2013.01)

(58) Field of Classification Search
CPC ........ G03F 7/0392; G03F 7/0045; G03F 7/20; G03F 7/38; G03F 7/40; G03F 7/0397; G03F 7/105; G03F 7/004; G03F 7/16; G03F 7/2004; C08F 212/24; C08F 220/18; C08F 220/30

See application file for complete search history.

(56) References Cited

U.S. PATENT DOCUMENTS 6,451,498 B1 *  9/2002  Pirri ...................... G03F 7/0392
                                                      430/910
6,753,125 B2    6/2004  Choi et al.
(Continued)

FOREIGN PATENT DOCUMENTS

EP    1262831 A2    12/2002
EP    2216683 A2    8/2010
(Continued)

OTHER PUBLICATIONS

Griffin;"A Simple Phase Transition Model for Metal Passivation Kinetics"; Journal of The Electrochemical Society, vol. 131, No. 1; 1984, pp. 18-21—Abstract Only.

*Primary Examiner* — Mark F. Huff
*Assistant Examiner* — Alexander Nicholas Lee
(74) *Attorney, Agent, or Firm* — CANTOR COLBURN LLP

(57) ABSTRACT

Disclosed herein is a pattern formation method, comprising (a) applying a layer of a photoresist composition over a semiconductor substrate, (b) pattern-wise exposing the photoresist composition layer to i-line radiation; and (c) developing the exposed photoresist composition layer to provide a resist relief image; wherein the photoresist composition comprises a non-ionic photoacid generator; a solvent; a first polymer and a second polymer; and wherein the first polymer comprises a polymeric dye.

15 Claims, 7 Drawing Sheets

(51) Int. Cl.
*G03F 7/20* (2006.01)
*G03F 7/38* (2006.01)
*G03F 7/40* (2006.01)

(56) References Cited

U.S. PATENT DOCUMENTS

| | | | |
|---|---|---|---|
| 6,780,953 B2 | 8/2004 | Jung et al. | |
| 6,887,648 B2 | 5/2005 | Pavelchek et al. | |
| 7,632,630 B2 | 12/2009 | Mori et al. | |
| 8,697,336 B2 | 4/2014 | Nakasugi et al. | |
| 8,900,797 B2 | 12/2014 | Nakasugi et al. | |
| 9,040,225 B2 | 5/2015 | Chen et al. | |
| 9,541,829 B2 | 1/2017 | Robello et al. | |
| 9,708,493 B2 | 7/2017 | Amara et al. | |
| 9,726,977 B2 | 8/2017 | Cameron et al. | |
| 10,040,965 B2 | 8/2018 | Kitanohara et al. | |
| 10,437,151 B2 | 10/2019 | Ogata et al. | |
| 10,539,873 B2 | 1/2020 | Cameron et al. | |
| 11,112,696 B2 | 9/2021 | Hashimoto et al. | |
| 2002/0076641 A1* | 6/2002 | Choi | G03F 7/0392 430/905 |
| 2005/0026080 A1* | 2/2005 | Jung | G03F 7/0045 430/281.1 |
| 2006/0063105 A1 | 3/2006 | Oberlander et al. | |
| 2006/0199107 A1* | 9/2006 | Kim | G03F 7/091 430/311 |
| 2009/0280435 A1* | 11/2009 | Mckenzie | G03F 7/091 430/285.1 |
| 2010/0233628 A1* | 9/2010 | Akita | C07C 69/00 560/81 |
| 2012/0308939 A1* | 12/2012 | Kudo | C09D 5/006 430/326 |
| 2013/0040238 A1 | 2/2013 | Chen et al. | |
| 2013/0122421 A1 | 5/2013 | Chen et al. | |
| 2013/0157196 A1 | 6/2013 | Shigemasa et al. | |
| 2014/0004712 A1 | 1/2014 | Kuang-Jung | |
| 2014/0087311 A1 | 3/2014 | Nakasugi et al. | |
| 2016/0013041 A1* | 1/2016 | Liu | G03F 7/425 438/703 |
| 2016/0072098 A1 | 3/2016 | Lee et al. | |
| 2018/0081274 A1 | 3/2018 | Ogata et al. | |
| 2018/0188648 A1* | 7/2018 | Haga | G03F 7/0046 |
| 2021/0311391 A1 | 10/2021 | Taniguchi et al. | |

FOREIGN PATENT DOCUMENTS

| | | | |
|---|---|---|---|
| EP | 2216684 A1 | 8/2010 | |
| EP | 2261738 A2 | 12/2010 | |
| FR | 2803293 A1 | 7/2001 | |
| JP | H08286384 A | 11/1996 | |
| JP | 10111563 A | 4/1998 | |
| JP | H10186647 A | 7/1998 | |
| JP | 2002088124 A | 3/2002 | |
| JP | 2010235925 A | 10/2010 | |
| JP | 2010250280 A | 11/2010 | |
| JP | 2010256859 A | 11/2010 | |
| JP | 2011053652 A | 3/2011 | |
| JP | 2014524942 A | 9/2014 | |
| JP | 2015507212 A | 3/2015 | |
| JP | 2015532313 A | 11/2015 | |
| KR | 2010047046 A | * | 5/2010 |
| KR | 2014129934 A | 11/2014 | |
| WO | 03058345 A2 | 7/2003 | |
| WO | 2008023750 A1 | 2/2008 | |
| WO | 2013023124 A2 | 2/2013 | |
| WO | 2013070511 A1 | 5/2013 | |
| WO | 2013089277 A1 | 6/2013 | |
| WO | 2014004828 A1 | 1/2014 | |
| WO | 2014049420 A2 | 4/2014 | |
| WO | 2014178497 A1 | 11/2014 | |
| WO | 2015013396 A1 | 1/2015 | |
| WO | 2015076314 A1 | 5/2015 | |
| WO | 2016158509 A1 | 10/2016 | |
| WO | 2018052130 A1 | 3/2018 | |
| WO | 2020039755 A1 | 2/2020 | |

* cited by examiner

Table 1

| Sample | | | #1 | #2 | #3 | #4 |
|---|---|---|---|---|---|---|
| Composition | PBW* | Second Polymer (PHS/TBA) Mw=22,000 g/mole | 100 | 98 | 95 | 90 |
| | | First Polymer PHS/TBA/ANT MA Mw = 8,900 g/mole | None | 2 | 5 | 10 |
| | | PAG NHNI-TF NHNI-PFBS PAG-103 | 0.21 0.79 1.00 | 0.21 0.79 1.00 | 0.21 0.79 1.00 | 0.21 0.79 1.00 |
| | | Quencher Troger's Base | 0.232 | 0.232 | 0.232 | 0.232 |
| | | SLA Poly FOX PF656 | 0.05 | 0.05 | 0.05 | 0.05 |
| | Solid Content | | 28.5% | 28.5% | 28.5% | 28.5% |
| Results | Absorbance at 365nm/μm | | 0.021 | 0.035 | 0.059 | 0.097 |
| | Sensitivity 15μm Iso Trench /mJ/cm$^2$ | | 40.2 | 29.5 | 23.2 | 18.9 |
| | Film Loss at Unexposed Area/nm | | 288 | 291 | 247 | 203 |
| | Cross Section Profile 15μm Iso Trench | |  |  |  |  |

*PBW=Parts by Weight

Table 3

| Sample | | #5 | #6 | #7 | #8 | #9 |
|---|---|---|---|---|---|---|
| Formulation | Second Polymer (Mw = 15,500 g/mole) | 100 | 100 | 100 | 100 | 100 |
| | PAG (NHNI-TF) | 1.0 | 1.0 | 1.0 | 1.0 | 1.0 |
| | Troger's Base | 0.102 | 0.051 | 0.102 | 0.051 | 0.076 |
| | tBOC-4HP | | 0.04 | | 0.04 | 0.02 |
| | First Polymer Polymeric Dye-A (Mw = 8900 g/mole) | 0.5 | 0.5 | 1.5 | 1.5 | 1.0 |
| | SLA | 1:0.03 | 1:0.03 | 1:0.03 | 1:0.03 | 1:0.03 |
| | Solvent Ratio | 95/5 | 95/5 | 95/5 | 95/5 | 95/5 |
| | Solvent Ratio | 33.7 | 33.7 | 33.7 | 33.7 | 33.7 |
| Test Results | $E_{th}$/ (msec) Film Loss/Nanometers (nm) | 98 15 | 92 15 | 74 14 | 74 12 | 86 13 |
| | $E_{op}$ /msec | 234 | 207 | 185 | 174 | 198 |
| | 10% Over Size/msec (Calculated) | 300 (311) | 280 (276) | 240 (241) | 240 (230) | 260 (261) |
| | +0.5μm Focus | 93.2° | 92.9° | 92.1° | 91.8° | 92.6° |
| | +1.5μm Focus | 92.1° | 91.8° | 91.2° | 91.4° | 91.7° |
| | +2.5μm Focus | 90.5° | 90.0° | 90.1° | 89.8° | 90.1° |

FIG. 4

Table 6

| Material | Chemical | Sample #18 | Sample #19 | Sample #20 | Sample #21 |
|---|---|---|---|---|---|
| Polymer | Second Polymer Polymer-B | 100 | 100 | 100 | 100 |
| PAG | NHNI-TF | --- | --- | 1.0 | 1.0 |
|  | NHNI-PFBS | 1.43 | 1.43 | --- | --- |
| Base Quencher | Troger's Base | 0.10 | 0.10 | 0.10 | 0.10 |
| DYE | First Polymer Polymeric Dye-A | --- | 1.5 | --- | 1.5 |
| Sensitivity | $E_{th}$ [msec] | 116 | 88 | 96 | 64 |
|  | $E_{op}$ [msec] (Calculated) | 260 (259) | 200 (200) | 260 (250) | 170 (173) |
|  | 10% OS [msec] (Calculated) | 360 (357) | 290 (289) | 320 (322) | 210 (216) |
| Sidewall Angle | At Eop, +0.00μm Focus | 94.6° | 93.7° | 92.2° | 90.1° |
|  | At 10% Oversize, +0.0μm Focus | 96.2° | 95.6° | 93.5° | 90.4° |

FIG. 5

Table 7

| Material | Chemical | Sample #22 | Sample #23 | Sample #24 | Sample #25 |
|---|---|---|---|---|---|
| Polymer | Second Polymer Polymer-C Polymer-E | 100 | 100 | 100 | 100 |
| PAG | NHNI-TF | 1.0 | 1.0 | 1.0 | 1.0 |
| Base Quencher | Troger's Base | 0.10 | 0.10 | 0.10 | 0.10 |
| DYE | First Polymer Polymeric Dye-A | --- | 1.5 | --- | 1.5 |
| Sensitivity | $E_{th}$ [msec] | 116 | 88 | 206 | 200 |
| | $E_{op}$ [msec] (Calculated) | 340 (352) | 200 (200) | 440 (434) | 360 (340) |
| | 10% OS [msec] (Calculated) | 460 (664) | 320 (327) | 740 (730) | 600 (592) |
| Sidewall Angle | At Eop, +0.00μm Focus | 93.8° | 93.6° | 97.0° | 96.3° |
| | At 10% Oversize, +0.0μm Focus | 94.8° | 93.9° | --- | --- |

FIG. 6

Table 10

| Material | Chemical | Sample #33 | Sample #34 | Sample #35 | Sample #36 |
|---|---|---|---|---|---|
| Polymer | Second Polymer Polymer-F | 100 | 100 | 100 | 100 |
| PAG | NHNI-TF | 1.0 | 1.0 | 1.0 | 1.0 |
| Base Quencher | Troger's Base | 0.10 | 0.10 | 0.10 | 0.10 |
| DYE | First Polymer Polymeric Dye-A | --- | 1.5 | --- | 1.5 |
| Sensitivity | $E_{th}$ [msec] | 116 | 88 | 206 | 200 |
| | $E_{op}$ [msec] (Calculated) | 508 (490) | 418 (410) | 662 (640) | 508 (480) |
| Sidewall Angle | At Eop, 0.00μm Focus | 93.8° | 93.1° | 94.1° | 93.5° |

FIG. 7

PHOTORESIST COMPOSITIONS AND PATTERN FORMATION METHODS

CROSS REFERENCE TO RELATED APPLICATIONS

This application claims the benefit of U.S. Provisional Application No. 63/132,686, filed Dec. 31, 2020, which is incorporated by reference in its entirety herein.

BACKGROUND

This disclosure relates to photoresist compositions and pattern formation methods. More specifically, the photoresist compositions have particular applicability in the electronics industry to the manufacture of semiconductor devices. In particular, this disclosure relates to photoresist compositions that comprise polymers having an anthracene chromophore.

Photoresist materials are photosensitive compositions that are used for transferring an image to one or more underlying layers such as a metal, semiconductor or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Chemically amplified (CA) photoresists are conventionally used for high-resolution processing. Such resists typically employ a polymer having acid-labile groups and a photoacid generator. Pattern-wise exposure to activating radiation through a photomask causes the acid generator to form an acid which, during post-exposure baking, causes cleavage of the acid-labile groups in exposed regions of the polymer. This creates a difference in solubility characteristics between exposed and unexposed regions of the resist in a developer solution. In a positive tone development (PTD) process, exposed regions of the photoresist layer become soluble in the developer and are removed from the substrate surface, whereas unexposed regions, which are insoluble in the developer, remain after development to form a positive image.

Substantial demand increase for thick layer resists has been experienced in recent years as the packaging industry continues to grow. Such applications use thick resist coatings ranging from 10 μm to approximately 100 μm. The exposure tools used in these applications employ i-line (365 nanometers (nm)) and longer wavelength radiations (g-h lines).

For thick layer resists it is desirable to minimize overhang. An overhung profile is one where the sidewall angle is larger than 90° (degrees). In other words, when the width is compared at the surface and bottom of the photoresist pattern using a scanning electron microscopy cross-sectional image, the width at the surface is narrower than that at the bottom.

It is desirable to develop photoresist compositions that display faster sensitivity and reduced overhang.

SUMMARY

Disclosed herein is a pattern formation method, comprising (a) applying a layer of a photoresist composition over a semiconductor substrate, (b) pattern-wise exposing the photoresist composition layer to i-line radiation; and (c) developing the exposed photoresist composition layer to provide a resist relief image; wherein the photoresist composition comprises a non-ionic photoacid generator; a solvent; a first polymer comprising first polymerized units of formula (1), second polymerized units of formula (2); and third polymerized units of formula (3):

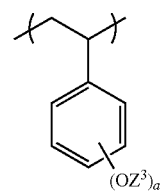
(1)

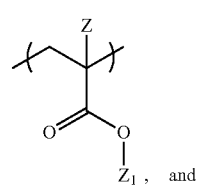
(2)

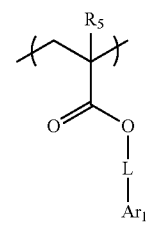
(3)

wherein a is 1 to 5 and $Z^3$ is a hydrogen or an alkyl group having 1 to 5 carbon atoms, Z and $R^5$ are independently selected from a hydrogen atom, $C_1$-$C_4$ alkyl, $C_1$-$C_4$ fluoroalkyl, or a cyano group; $Z^1$ is a non-hydrogen substituent comprising an acid-labile group, the cleavage of which forms a carboxylic acid on the polymer; L is a divalent linking group; $Ar_1$ is a substituted or unsubstituted anthracene group; wherein the first polymer is present in the photoresist composition in an amount of from 0.1 to 10 wt %, based on total solids of the photoresist composition; and a second polymer comprising first polymerized units of formula (4)

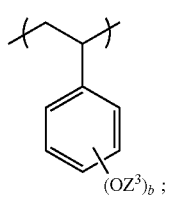
(4)

wherein b is 1 to 5 and $Z^3$ is a hydrogen or an alkyl group having 1 to 5 carbon atoms; and second polymerized units of a monomer comprising an acid-labile group; and wherein the second polymer is free of polymerized units of formula (3): present in the photoresist composition in an amount of 10 to 99 wt %, based on total solids of the photoresist composition.

BRIEF DESCRIPTION OF THE FIGURES

FIG. 4 depicts Table 3;
FIG. 5 depicts Table 6;
FIG. 6 depicts Table 7;
and
FIG. 7 depicts Table 10.

DETAILED DESCRIPTION

Figures 1A, 1B:
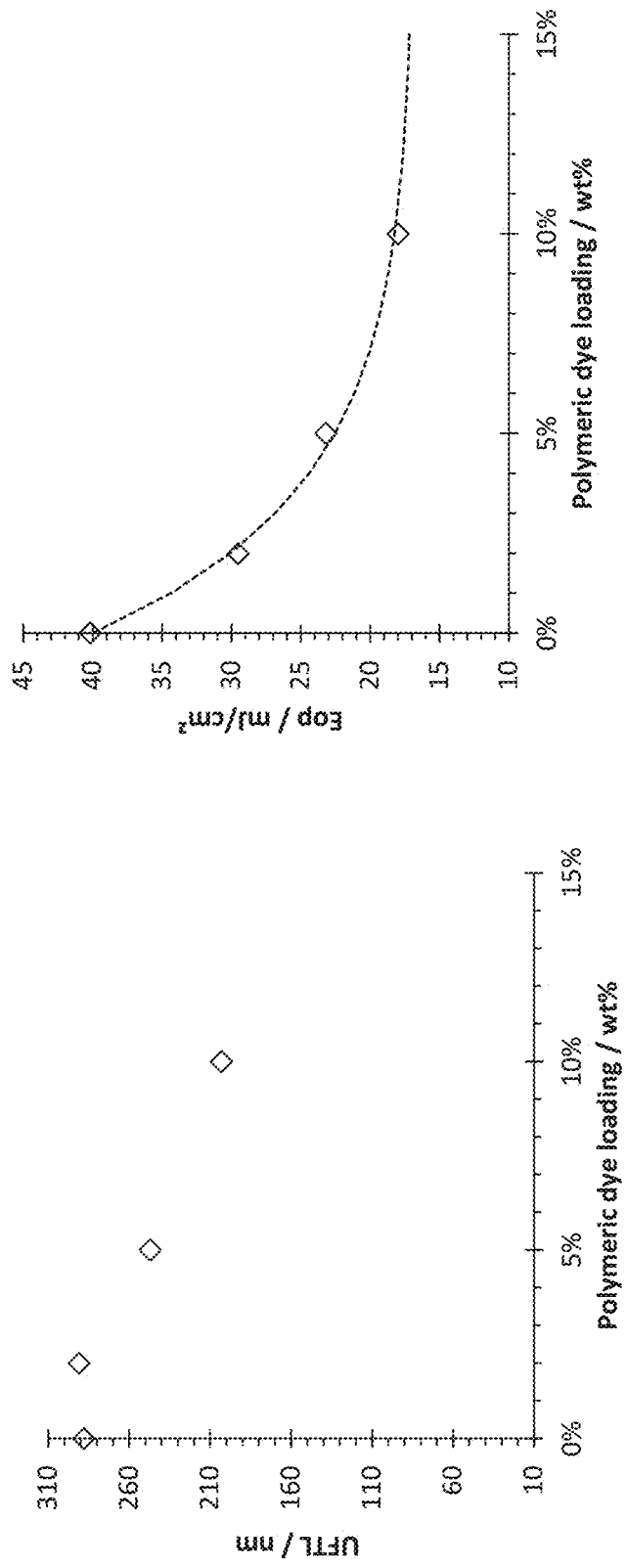
FIG. 1A is a graph that depicts film loss (dark erosion) in the unexposed area.
FIG. 1B is a graph that depicts sensitivity ($E_{op}$) shift as a function of polymeric dye (first polymer) loading.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-labile groups," and "acid-sensitive groups."

"Substituted" means that at least one hydrogen atom on the group is replaced with another atom or group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—$NO_2$), cyano (—CN), hydroxy (—OH), oxo (=O), amino (—$NH_2$), mono- or di-($C_{1-6}$) alkylamino, alkanoyl (such as a $C_{2-6}$ alkanoyl group such as acyl), formyl (—C(=O)H), carboxylic acid or an alkali metal or ammonium salt thereof; esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl); amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$-). When a group is substituted, the indicated number of carbon atoms is the total number of carbon atoms in the group, excluding those of any substituents. For example, the group —$CH_2CH_2$CN is a $C_2$ alkyl group substituted with a cyano group.

In the present specification, "(meth)acrylate" represents "at least one of acrylate and methacrylate." In addition, "(meth)acrylic acid" means "at least one of acrylic acid and methacrylic acid".

The term "alkyl", as used herein, means a branched or straight chain saturated aliphatic hydrocarbon group having the specified number of carbon atoms, generally from 1 to about 12 carbon atoms. The term $C_1$-$C_6$ alkyl as used herein indicates an alkyl group having from 1, 2, 3, 4, 5, or 6 carbon atoms. Other embodiments include alkyl groups having from 1 to 8 carbon atoms, 1 to 4 carbon atoms or 1 or 2 carbon atoms, e.g. $C_1$-$C_6$ alkyl, $C_1$-$C_4$ alkyl, and $C_1$-$C_2$ alkyl. When $C_0$-$C_n$ alkyl is used herein in conjunction with another group, for example, (cycloalkyl)$C_0$-$C_4$ alkyl, the indicated group, in this case cycloalkyl, is either directly bound by a single covalent bond ($C_0$), or attached by an alkyl chain having the specified number of carbon atoms, in this case 1, 2, 3, or 4 carbon atoms. Examples of alkyl include, but are not limited to, methyl, ethyl, n-propyl, isopropyl, n-butyl, 3-methylbutyl, t-butyl, n-pentyl, and sec-pentyl.

The term "cycloalkyl", as used herein, indicates a saturated hydrocarbon ring group, having only carbon ring atoms and having the specified number of carbon atoms, usually from 3 to about 8 ring carbon atoms, or from 3 to about 7 carbon atoms. Examples of cycloalkyl groups include cyclopropyl, cyclobutyl, cyclopentyl, or cyclohexyl as well as bridged or caged saturated ring groups such as norborane or adamantane.

The term "heterocycloalkyl", as used herein, indicates a saturated cyclic group containing from 1 to about 3 heteroatoms chosen from N, O, and S, with remaining ring atoms being carbon. Heterocycloalkyl groups have from 3 to about 8 ring atoms, and more typically have from 5 to 7 ring atoms. Examples of heterocycloalkyl groups include morpholinyl, piperazinyl, piperidinyl, and pyrrolidinyl groups. A nitrogen in a heterocycloalkyl group may optionally be quaternized.

In citations for a group and an atomic group in the present specification, in a case where the group is denoted without specifying whether it is substituted or unsubstituted, the group includes both a group and an atomic group not having a substituent, and a group and an atomic group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

The term "aryl", as used herein, means aromatic groups containing only carbon in the aromatic ring or rings. Typical aryl groups contain 1 to 3 separate, fused, or pendant rings and from 6 to about 18 ring atoms, without heteroatoms as ring members. When indicated, such aryl groups may be further substituted with carbon or non-carbon atoms or groups. Bicyclic aryl groups may be further substituted with carbon or non-carbon atoms or groups. Bicyclic aryl groups may contain two fused aromatic rings (naphthyl) or an aromatic ring fused to a 5- to 7-membered non-aromatic cyclic group that optionally contains 1 or 2 heteroatoms independently chosen from N, O, and S, for example, a 3,4-methylenedioxy-phenyl group. Aryl groups include, for example, phenyl, naphthyl, including 1-naphthyl and 2-naphthyl, and bi-phenyl.

"Halo" or "halogen" is any of fluoro, chloro, bromo, and iodo.

Disclosed herein is a photoresist composition that comprises a non-ionic photoacid generator; an organic solvent and a first polymer comprising first polymerized units of a first vinyl aromatic monomer, second polymerized units of a first ethylenically unsaturated double bond having a pendent acid-labile group; and third polymerized units of an ethylenically unsaturated double bond having a substituted or unsubstituted aromatic group having three fused aromatic rings; and a second polymer comprising first polymerized units of a second vinyl aromatic monomer and second polymerized units of a second ethylenically unsaturated double bond having a pendent acid-labile group.

Disclosed herein too is a method of manufacturing and using the photoresist composition. The photoresist composition is manufactured by blending the photoacid generator, the first polymer and the second polymer in a solvent. The photoresist composition could be optionally filtered or pass through an ion-exchanged resin. A layer (e.g., film) of the photoresist composition is then applied on a semiconductor substrate. The photoresist composition layer is exposed to i-line radiation in a patternwise fashion. The exposed photoresist composition layer is then developed to provide a resist relief image.

The first polymer is typically a copolymer comprising three or more different repeat units. The copolymer may be a random copolymer, a block copolymer, a star block copolymer, a gradient copolymer, or the like, with a random copolymer being preferred.

The first polymerized unit of the first polymer has the structure shown in formula (1) below:

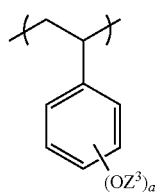

(1)

wherein a is 1 to 5 and where $Z^3$ is a hydrogen or an alkyl group having 1 to 5 carbon atoms. In a preferred embodiment, a is 1 and $Z^3$ is hydrogen. It is preferable for the first polymerized unit of the first polymer to have a hydroxyl group located in the para-position on the aryl ring. A preferred first polymerized unit of the first polymer is poly(p-hydroxystyrene).

The first polymerized units of the first polymer is typically present in the first polymer in an amount of 30 to 90 mole percent (mol %), typically 50 to 80 mol %, 55 to 75 mol %, or 63 to 75 mol %, based on total repeating units in the first polymer.

The second polymerized unit of the first polymer has the structure shown in formula (2) below:

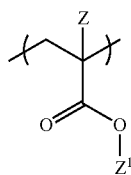

(2)

wherein Z is selected from a hydrogen atom, substituted or unsubstituted $C_1$-$C_4$ alkyl, substituted or unsubstituted $C_1$-$C_4$ fluoroalkyl or a cyano group; $Z^1$ is a non-hydrogen substituent comprising an acid-labile group, the cleavage of which forms a carboxylic acid on the polymer. Additional details pertaining to Z and $Z^1$ are provided below. In formulas (2a) and (2b) below Z is replaced by R.

In an embodiment, the acid-labile group which, on decomposition, forms a carboxylic acid group on the polymer is preferably a tertiary ester group of the formula —C(O)OC($R^1$)3 or an acetal group of the formula —C(O)OC($R^2$)$_2$O$R^3$, wherein: $R^1$ is each independently linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_3$_6 alkyl, or monocyclic or polycyclic $C_{3-10}$ cycloalkyl, each of which is substituted or unsubstituted, each $R^1$ optionally including as part of its structure one or more groups chosen from —O—, —C(O)—, —C(O)—O-, or -5-, and any two $R^1$ groups together optionally forming a ring; $R^2$ is independently hydrogen, fluorine, linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably hydrogen, linear $C_{1-6}$ alkyl, branched $C_{3-6}$ alkyl, or monocyclic or polycyclic $C_{3-10}$ cycloalkyl, each of which is substituted or unsubstituted, each $R^2$ optionally including as part of its structure one or more groups chosen from —O—, —C(O)—, —C(O)—O-, or -5-, and the $R^2$ groups together optionally forming a ring; and $R^3$ is linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, $R^3$ optionally including as part of its structure one or more groups chosen from —O—, —C(O)—, —C(O)—O-, or -5-, and one $R^2$ together with $R^3$ optionally forming a ring. Such monomer is typically a vinyl aromatic, (meth)acrylate, or norbornyl monomer.

Suitable monomers comprising such an acid-labile group include monomers of the following formulas (2a) and (2b):

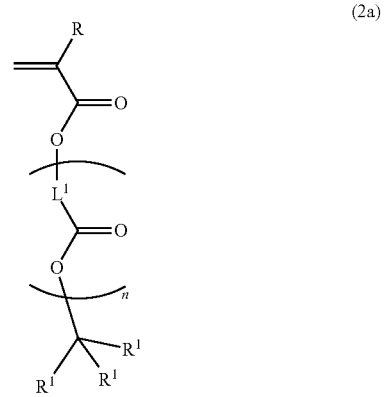

(2a)

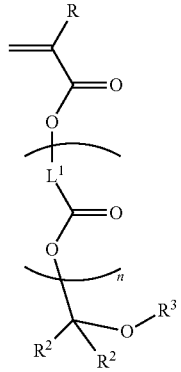

(2b)

wherein: R is hydrogen, $C_{1-4}$ alkyl, or $C_{1-4}$ fluoroalkyl, typically hydrogen or methyl; $R^2$, and $R^3$ are as defined above; $L^1$ is a divalent linking group comprising at least one carbon atom, typically $C_{1-10}$ alkylene, for example, $C_{1-10}$ linear, $C_{3-10}$ branched, or $C_{3-10}$ cyclic alkylene, or a combination thereof, each of which may be substituted or unsubstituted, and may include one or more heteroatoms, for example, O, S, or N; and wherein n is 0 or 1. In a preferred embodiment, n is 0.

Suitable such monomers comprising an acid-labile group include, for example, the following structures shown below:

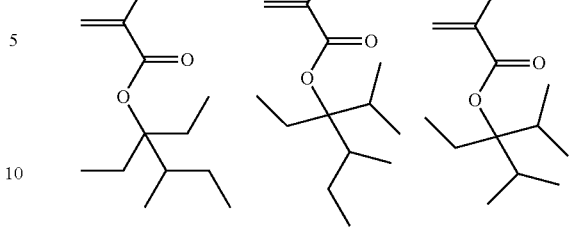

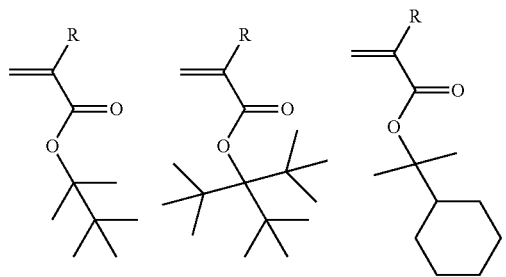

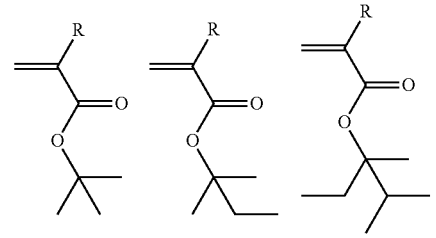

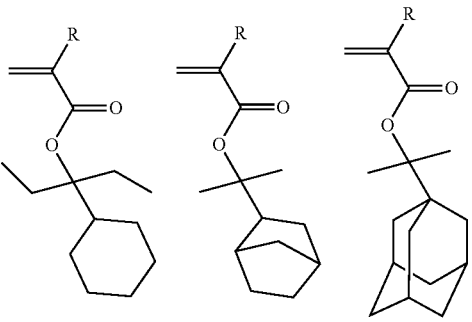

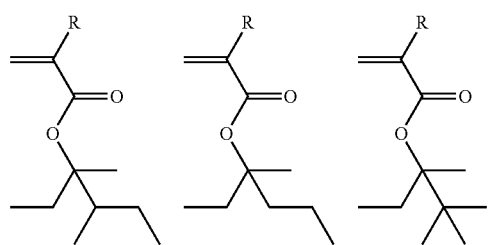

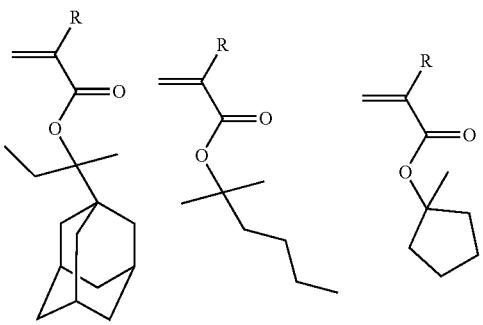

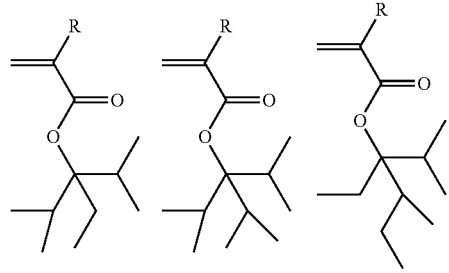

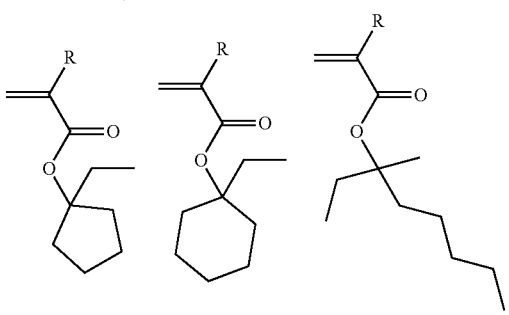

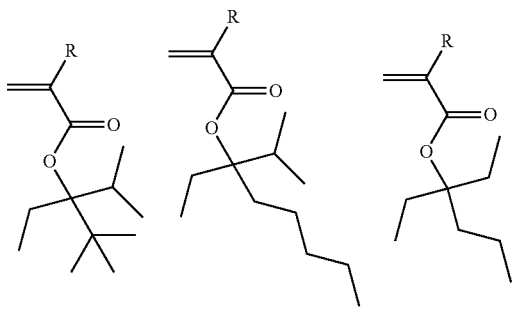
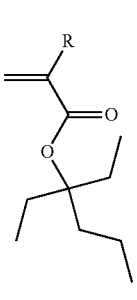
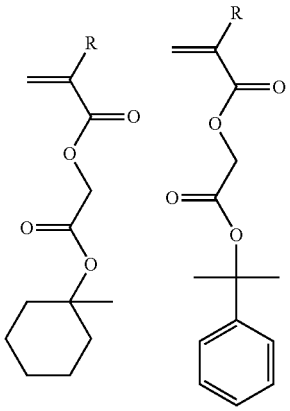
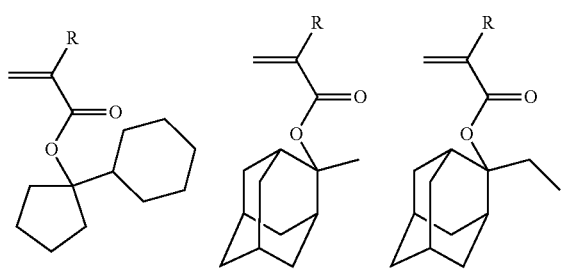
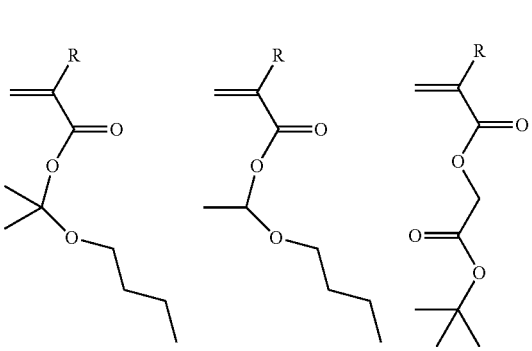
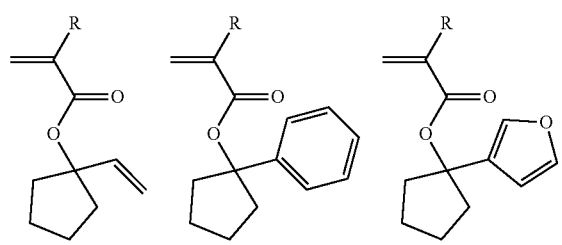
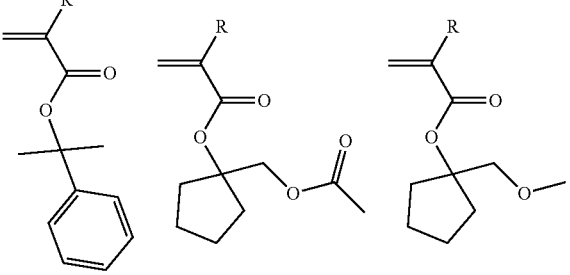
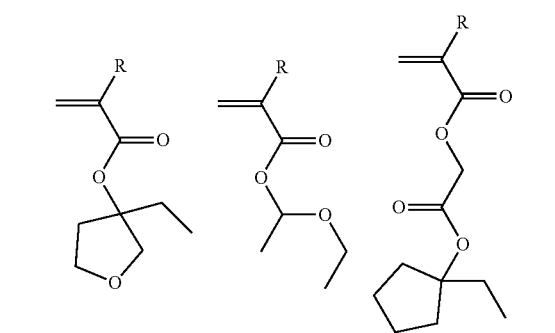
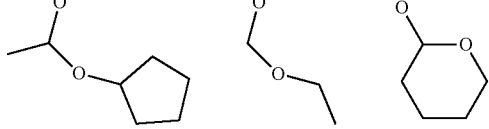
wherein R is as defined above in formula (2a) and (2b).
The total content of polymerized units of formula (2) in the first polymer is typically from 1 to 65 mole %, more typically from 5 to 50 mole % or from 5 to 30 mole %, based on total number of moles of the first polymer. A preferred monomer used in forming the second polymerized unit is tert-butyl methacrylate.

The third polymerized unit of the first polymer has the structure shown in formula (3) below

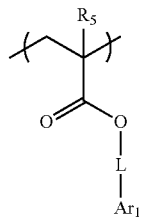

(3)

wherein L is a divalent linking group, wherein $R^5$ is selected from a hydrogen atom, $C_1$-$C_4$ alkyl, $C_1$-$C_4$ fluoroalkyl, or a cyano group and wherein $Ar_1$ is a substituted or unsubstituted anthracene group. Examples of divalent linking groups include substituted or unsubstituted alkylenes preferably having 1 to about 4 carbons. In a preferred embodiment, the divalent linking group is an unsubstituted methylene group.

In an embodiment, the third polymerized unit has the structure shown in formula (3a) below:

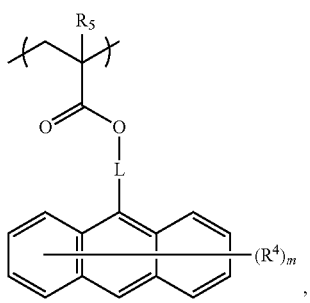

(3a)

wherein L is a divalent linking group, where $R^5$ is as defined above and wherein each $R^4$ may be independently hydrogen, halogen (F, Cl, Br, I); substituted or unsubstituted alkyl preferably having 1 to about 12 carbon atoms; substituted or unsubstituted alkoxy preferably having 1 to about 12 carbon atoms; substituted or unsubstituted alkenyl preferably having 2 to about 12 carbon atoms; substituted or unsubstituted alkynyl preferably having 2 to about 12 carbon atoms; substituted or unsubstituted alkylthio preferably having 1 to about 12 carbon atoms; cyano; nitro; amino; hydroxyl; m is an integer of from 0 (where the anthracenyl ring is fully hydrogen-substituted) to 9. In an embodiment, m is preferably 0, 1 or 2. In a preferred embodiment in structure 3(a), L is an unsubstituted methylene group and m is 0. A preferred third polymerized unit has the following structure:

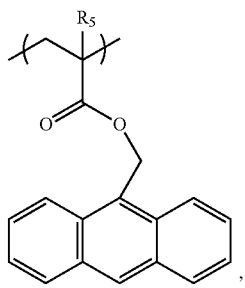

wherein $R^5$ is hydrogen.

The third polymerized unit is typically present in the first polymer in an amount of 5 to 30 mole percent (mol %), typically 15 to 27 mol %, more typically 18 to 24 mol %, based on total number of moles of the first polymer. Typically, the first polymer has a molecular weight of 5,000 to 15,000 grams per mole.

In an exemplary embodiment, the first polymer is a copolymer having the structure shown in formula (4)

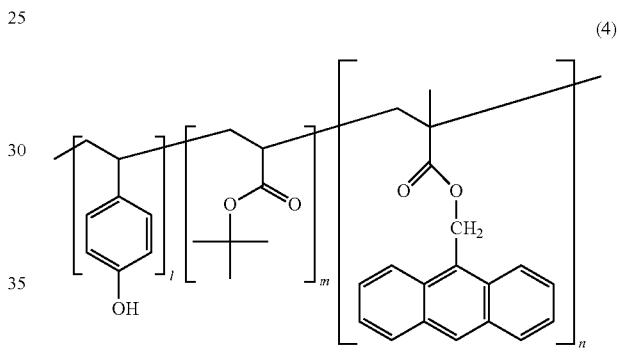

(4)

wherein 1, m and n represent the molar content of each polymerized unit and add up to 100 mol %. In an embodiment, 1 is 40 to 75 mol %, m is 8 to 16 mol % and n is 5 to 30 mol%, based on total moles of the copolymer. The total weight average molecular weight of the polymer of formula (4) is typically 5,000 to 15,000 grams per mole (g/mole), preferably 7,500 to 12,500 g/mole using a polystyrene standard.

In an embodiment, the first polymer (that comprises the first polymerized unit, the second polymerized unit and the third polymerized unit) is present in the photoresist composition in an amount of from 0.1 to 20 wt %, preferably 1 to 9 wt % and more preferably 3 to 8 w t%, based on total solids of the photoresist composition.

The second polymer is a copolymer that comprises first polymerized units of a vinyl aromatic monomer and second polymerized units of a monomer comprising an acid-labile group, while being free of polymerized units of formula (3). The second polymer may also be a random copolymer, a block copolymer, a star block copolymer, a gradient copolymer, or the like, with a random copolymer being preferred.

In an embodiment, the vinyl aromatic polymerized unit of the second polymer may be the same or different from the first (vinyl aromatic) polymerized unit of the first polymer. In a preferred embodiment, the vinyl aromatic polymerized unit of the second polymer is different either in chemical structure or in molecular weight from the vinyl aromatic polymerized unit of the first polymer.

In an embodiment, the first polymerized unit of the second polymer has the structure of formula (5)

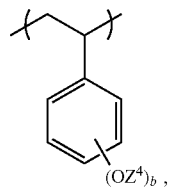
(5)

wherein b is 1 to 5 and wherein $Z^4$ is a hydrogen or an alkyl group having 1 to 5 carbon atoms. In a preferred embodiment, b is 1 and $Z^3$ is a hydrogen. In a preferred embodiment, the substituent is a hydroxyl group located in the para-position on the aryl ring. In a preferred embodiment, the first polymerized unit of the second polymer is a poly(p-hydroxystyrene).

In one embodiment, the first polymerized unit is typically present in the second polymer in an amount of 40 to 90 mole percent (mol %), typically 52 to 76 mol %, more typically 55 to 72 mol %, based on total number of moles of the second polymer.

The second polymerized unit of the second polymer may be the same or different from the second polymerized unit of the first polymer as described above in formula (2) or in formula (7) below. In an embodiment, the second polymerized unit of the second polymer is different from the second polymerized unit of the first polymer either in chemical structure or in molecular weight.

The second polymer may alternatively comprise a second polymerized unit derived via polymerization of an ethylenically unsaturated monomer comprising a phenolic group protected with an acetal or ketal group. In an embodiment, the second polymerized unit of the second polymer may be derived from a monomer of formula (7):

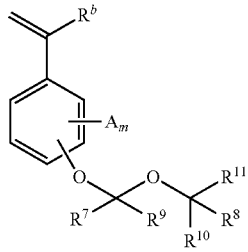
(7)

In formula (7), $R^b$ is hydrogen, fluorine, a substituted or unsubstituted $C_{1-5}$ alkyl, or a substituted or unsubstituted $C_{1-5}$ fluoroalkyl; each A is independently a halogen, a hydroxy, a carboxylic acid or ester, a thiol, a straight chain or branched $C_{1-20}$ alkyl, a monocyclic or polycyclic $C_{3-20}$ cycloalkyl, a monocyclic or polycyclic $C_{3-20}$ fluorocycloalkenyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted; and m is independently an integer of 0 to 4. Preferably, $R^b$ is hydrogen or methyl, A is hydroxy, and m is 0 or 1.

In formula (7), $R^{11}$, $R^{10}$, and $R^8$ are each independently hydrogen, a straight chain or branched $C_{1-20}$ alkyl, a straight chain or branched $C_{1-20}$ heteroalkyl, a monocyclic or polycyclic $C_{3-20}$ cycloalkyl, a monocyclic or polycyclic $C_{3-20}$ heterocycloalkyl, a monocyclic or polycyclic $C_{6-20}$ aryl, a $C_{7-20}$ aryloxyalkyl, or a monocyclic or polycyclic $C_{4-20}$ heteroaryl, each of which is substituted or unsubstituted. In an embodiment, any two of $R^{11}$, $R^{10}$, and $R^8$ together optionally may form a ring. In a further embodiment, a polycyclic structure can be formed by $R^{11}$, $R^{10}$, and $R^8$ together.

In formula (7), $R^7$ is hydrogen, a substituted or unsubstituted straight chain or branched $C_{1-20}$ alkyl, a substituted or unsubstituted monocyclic or polycyclic $C_{3-20}$ cycloalkyl, a substituted or unsubstituted monocyclic or polycyclic $C_{3-20}$ heterocycloalkyl, a substituted or unsubstituted $C_{6-14}$ aryl, a substituted or unsubstituted $C_{3-14}$ heteroaryl, a substituted or unsubstituted $C_{7-18}$ arylalkyl, a substituted or unsubstituted $C_{4-18}$ heteroarylalkyl, or a substituted or unsubstituted $C_{1-12}$ heteroalkyl.

In formula (7), $R^9$ is hydrogen, a substituted or unsubstituted straight chain or branched $C_{1-20}$ alkyl, a substituted or unsubstituted monocyclic or polycyclic $C_{3-20}$ cycloalkyl, a substituted or unsubstituted monocyclic or polycyclic $C_{3-20}$ heterocycloalkyl, a substituted or unsubstituted $C_{6-14}$ aryl, a substituted or unsubstituted $C_{3-14}$ heteroaryl, a substituted or unsubstituted $C_{7-18}$ arylalkyl, a substituted or unsubstituted $C_{4-18}$ heteroarylalkyl, or a substituted or unsubstituted $C_{1-12}$ heteroalkyl. In an embodiment, $R^7$ and $R^9$ are the same.

In formula (7), W and $R^9$ may optionally together form a ring.

In formula (7), in another embodiment, one of $R^7$ or $R^9$ optionally forms a ring with one of $R^8$, $R^{10}$ or $R^{11}$.

For example, the second polymer may contain a repeating unit derived from a monomer of formula (7a):

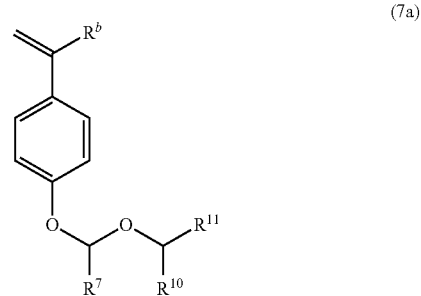
(7a)

wherein $R^b$, $R^{11}$, $R^{10}$ and $R^7$ are the same as defined for formula (7). In an embodiment, $R^{10}$ and $R^{11}$ are not both hydrogen. In an aspect, $R^{10}$ and $R^{11}$ together optionally may form a ring. In another aspect, $R^7$ and one of $R^{10}$ or $R^{11}$ together optionally may form a ring.

Non-limiting examples of monomers of formula (7a) include:

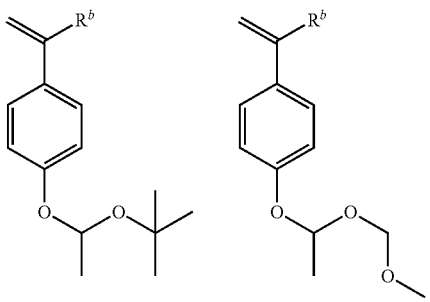

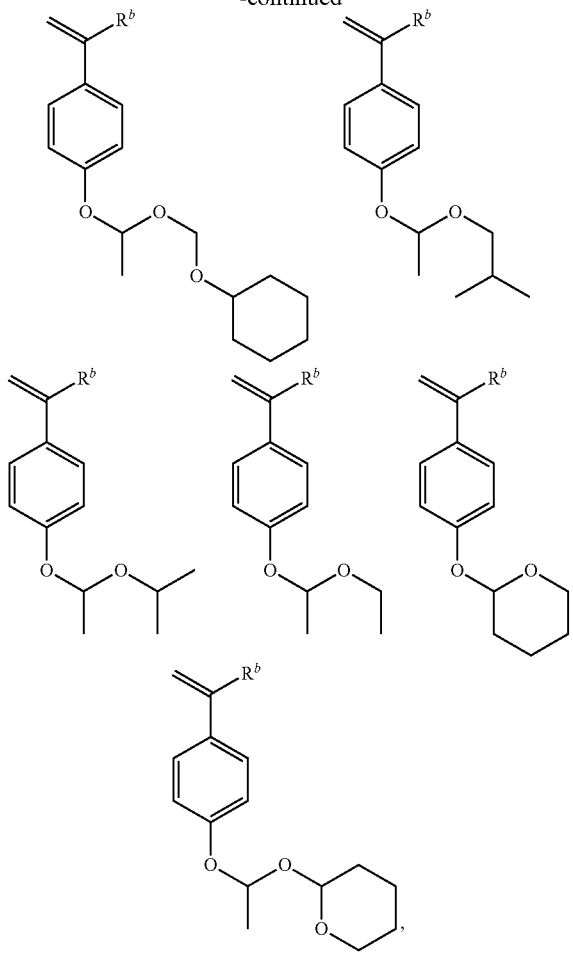

where $R^b$ is defined in formula (7) above.

In an embodiment, the second polymer may include the first polymerized unit that is derived from a monomer of formula (5) and/or the second polymerized unit that is derived from a monomer of formula (2) and/or that is derived from a monomer of formula (7).

In one embodiment, the second polymerized unit is typically present in the second polymer in an amount of 10 to 40 mole percent (mol %), preferably 12 to 39 mol %, more preferably 14 to 38 mol %, based on total number of moles of the second polymer.

In an exemplary embodiment, the second polymer is a copolymer having the structure shown in formula (8)

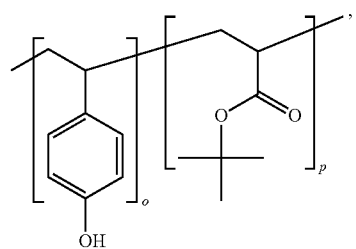

wherein o is 40 to 90 mol %, preferably 54 to 70 mol %, and more preferably 56 to 66 mol%, and p is 10 to 60 mol %, preferably 15 to 46 mol %, more preferably 20 to 42 mol%, and most preferably 25 to 38 mol %, based on the total molar content of the second polymer.

In an embodiment, the second polymer may comprise three different repeat units so long as it is free of the polymerized units of formula (3). In an embodiment, the second polymer may comprise repeat units of the formulas (5) and/or (7).

In another exemplary embodiment, the second polymer is a copolymer having the structure shown in formulas (9)-(12):

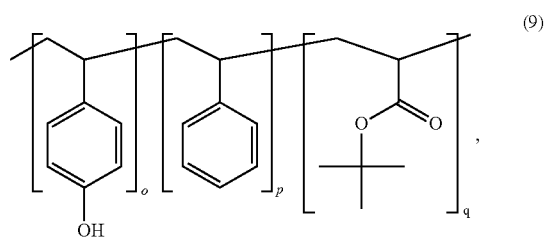

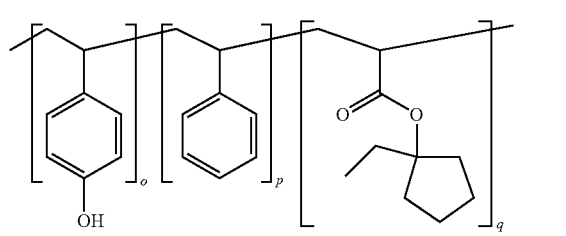

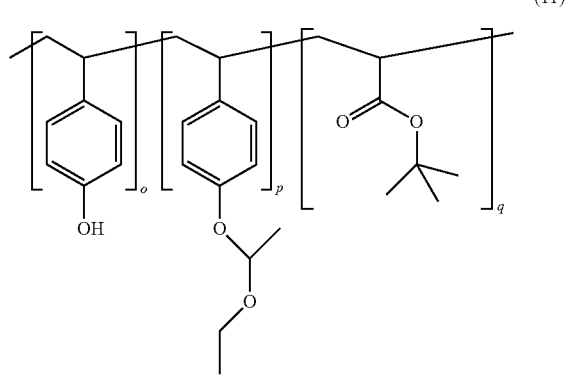

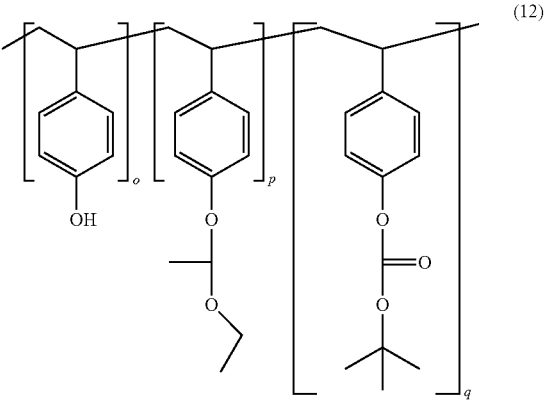

wherein o is 50 to 85 mol %, preferably 54 to 70 mol %, more preferably 56 to 67 mol %, and p is 5 to 30 mol %, preferably 18 to 24 mol %, and q is 10 to 25 mol %, preferably 14 to 18 mol %, based on the total molar content of the second polymer.

In an embodiment, the second polymer has a higher average molecular weight than the first polymer. The second polymer has a weight average molecular weight of 5,000 g/mole to 50,000 g/mole, preferably 10,000 to 40,000 g/mole, and more preferably 14,000 to 25000g/mole.

In an embodiment, the second polymer (that comprises the first polymerized unit and the second polymerized unit) is present in the photoresist composition in an amount of 10 to 99 wt % based on total solids of the photoresist composition.

The photoresist composition also comprises a non-ionic photoacid generator. In an embodiment, the photoresist composition does not contain an ionic photoacid generator. It is desirable to use photoacid generators that generate the photoacid by a Norrish-1 cleavage. The Norrish-I reaction is the photochemical cleavage or homolysis of aldehydes and ketones into two free radical intermediates. The carbonyl group accepts a photon and is excited to a photochemical singlet state. In an embodiment, the photoacid generator has the structure shown in formula (13)

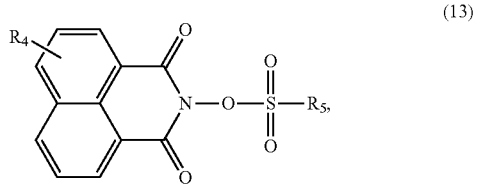

(13)

wherein in formula (13), $R_4$ is a hydrogen atom, a substituted or unsubstituted, linear or branched $C_1$ to $C_{14}$ alkyl group, a substituted heterocyclic group, or a halogen atom; and wherein R5 is a substituted or unsubstituted alkyl group having 1 to 18 carbon atoms; a halogen atom, or an aryl group having 6 to 20 unsubstituted carbon atoms.

Examples of suitable photoacid generators are N-hydroxynaphthalimide trifluoromethanesulfonate (NHNI-TF), N-hydroxynaphthalimide perfluoro-1-butanesulfonate (NHNI-PFBS), N-hydroxynaphthalimide camphor-10-sulfonate, N-hydroxynaphthalimide 2-trifluoromethylphenylsulfonate, N-hydroxy-5-norbornene-2,3-dicarboximide perfluoro-1-butanesulfonate, N-(trifluoromethyl sulfonyloxy)phthalimide, N-hydroxysuccinimide perfluorobutanesulfonate or benzeneacetonitrile, 2-methyl-α-[2-[[(propyl sulfonyl)oxy]imino]-3 (2H)-thienylidene]-(commercially available as IRGACURE PAG 103). In a preferred embodiment, the photoacid generator may be one or more of the structures of formulas (13a), (13b) or (13c) shown below

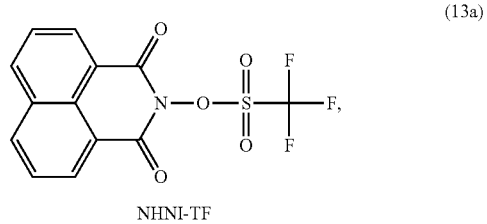

NHNI-TF (13a)

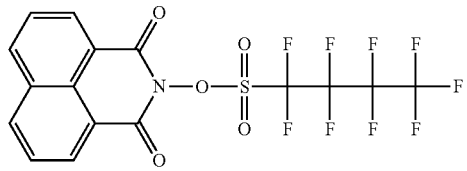

NHNI-PFBS (13b)

or

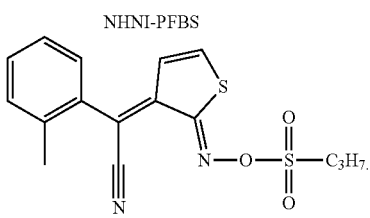

IRGACURE PAG 103

The photoacid generator is present in the photoresist composition in an amount of from 0.5 to 30 wt %, more typically 0.7 to 20 wt %, and more preferably 0.9 to 15 wt %, based on total solids of the photoresist composition.

The photoresist composition also comprises a solvent. The solvent is used to solvate polymers used in the composition and to facilitate miscibility of the various ingredients used in the composition. In some embodiments, the photoresist composition in solution comprises the polymer in an amount of 5 to 80 wt %, specifically 10 to 60 wt %, more specifically 15 to 40 wt %, based on the weight of the total solids. It will be understood that "polymer" used in this context of a component in a resist may mean only the copolymers disclosed herein, or a combination of the copolymer with another polymer useful in a photoresist. It will be understood that total solids includes polymer, photo destroyable base, quencher, surfactant, any added PAG, and any optional additives, exclusive of solvent.

Solvents generally suitable for dissolving, dispensing, and coating include anisole, alcohols including 1-methoxy-2-propanol (also referred to as propylene glycol methyl ether, PGME), and 1-ethoxy-2 propanol, esters including n-butyl acetate, 1-methoxy-2-propyl acetate (also referred to as propylene glycol methyl ether acetate, PGMEA), methoxyethyl propionate, ethoxyethyl propionate, ketones including cyclohexanone, 2,6-dimethyl-4-heptanone, 2 heptanone; ethyl lactate (EL), 2-hydroxyisobutyric acid methyl ester (HBM), gamma-butyrolactone (GBL), 3-methoxypropanoic acid methyl ester, and combinations thereof.

The solvent amount can be, for example, 20 to 95 wt %, preferably 40 to 90 wt %, and more preferably 60 to 52 wt %, based on the total weight of the photoresist composition.

The photoresist composition may further comprise a base quencher. The base quencher may include non-photodegradable bases, such as those based on hydroxides, carboxylates, amines, imines and amides. Preferably, the quencher includes a $C_{1-30}$ organic amine, imine or amide, or a strong base (e.g., hydroxide or alkoxide) or weak base (e.g., carboxylate)

In an embodiment, the base quencher comprises a first quencher and a second quencher.

The first quencher is effective to reduce footing profile issues at the bottom of the photoresist patterns on a metal layer. When a radiation-sensitive (photoresist) film is formed on a metal layer such as a copper or copper alloy layer, the photosensitivity of the film can be reduced in the region of its interface with the metal layer. It is believed that this reduction in photosensitivity results from consumption of generated photoacid by metal ions formed at the resist film/metal layer interface in an electrochemical reaction (see Griffin et al, A Simple Phase Transition Model for Metal Passivation Kinetics, J. Electrochem. Soc., vol. 131, No.1, pages 18-21). This is believed to result in a low concentration of photoacid at the interface. As a consequence, acid-catalyzed cleavage of the acid-labile moiety of the resin would be less efficient at the resist/copper interface and footing would result. The first quencher is believed to be effective to inhibit formation of metal ions at the resist film/metal layer interface.

The first quencher is selected from benzotriazole or its derivatives. Examples of benzotriazole derivatives include, but are not limited to, 1H-benzotriazole-1-methanol, 1-aminobenzotriazole, 1-(formamidomethyl)-1H-benzotriazole, 1-(methoxymethyl)-1H-benzotriazole, 2-(2-hydroxy-5-methylphenyl)benzotriazole, 2-(2-hydroxy-5-tert-ocrylphenyl)benzotriazole, 5-methyl-1H-benzoriazole, 5,6-methyl-1H-benzotriazole and 5,6-dimethyl-1,2,3-benzotriazole hydrate. Preferably, benzotriazole, 1H-benzotriazole-1-methanol, 5-methyl-1H-benzoriazole or 5,6-dimethyl-1,2,3-benzotriazole hydrate can be used for the invention. The inventors have found that benzotriazole or derivatives thereof can prevent the formation of metal ions such as copper ions, without decreasing sensitivity of the radiation-sensitive film.

The amount of the first quencher in the radiation-sensitive film is preferably from 0.001 to 1.0 wt %, more preferably from 0.005 to 0.2 wt %, and most preferably from 0.01 to 0.1 wt %, based on the total weight of solids.

The second quencher is believed to be work as an acid diffusion control in the middle or upper surface regions of the radiation-sensitive film to compensate for the relatively high volatility of the benzotriazole analogues. When the radiation-sensitive film is formed without use of the second quencher, the contact hole sidewalls can have a tapered profile. Straight and perpendiclar sidewalls are highly favorable in metal pillar bump formation. The second quencher is selected from amine compounds with exception of normal and branched tertiary alkyl amines.

Examples of the second quencher include, but are not limited to, N,N-diethyldodecanamide, 2,8-dimethyl-6H, 12H-5,11-methanodibenzo[b,f][1,5] diazocine (Troger's Base), 1,1-dimethylethyl 4-hydroxypiperidine-1-carboxylate and N-allylcaprolactam.

The amount of the second quencher in the radiation-sensitive film is preferably from 0.001 to 1.2 wt %, more preferably from 0.01 to 0.8 wt % or from 0.02 to 0.2 wt % based on the total weight of solids.

In an embodiment, the mole ratio percentage of the quencher to the photoacid generator (expressed as a percentage) is 5 to 50%, preferably 8 to 30%, and most preferably 10 to 15%.

The radiation-sensitive composition can comprise other optional ingredients, such as one or more surface leveling agent (SLA), adhesion promoter and/or plasticizer. If used, the SLA is preferably present in an amount of from 0.001 to 0.1 wt % based on total solids of the composition, and the adhesion promoter and/or plasticizer each in an amount of from 0.1 to 10 wt % based on total solids of the composition.

Processes which make use of the photoresist compositions will now be described. In accordance with a patterning process, a layer of the photoresist composition is formed on a substrate. The composition can be applied to the substrate by spin-coating, dipping, roller-coating or other conventional coating technique. Spin-coating is preferred. For spin-coating, the solids content of the coating solution can be adjusted to provide a desired film thickness based upon the specific coating equipment utilized, the viscosity of the solution, the speed of the coating tool and the amount of time allowed for spinning. In an embodiment, the layer of the photoresist composition is applied in a single application.

The photoresist composition layer can next be soft-baked to minimize the solvent content in the film, thereby forming a tack-free coating and improving adhesion of the layer to the substrate. The soft-bake can be conducted on a hotplate or in an oven, with a hotplate being typical.

The photoresist composition layer is then patternwise exposed to activating radiation through a photomask to create a difference in solubility between exposed and unexposed regions. References herein to exposing a photoresist composition layer to radiation that is activating for the layer indicates that the radiation is capable of forming a latent image in the layer. The photomask has optically transparent and optically opaque regions corresponding to regions of the resist layer to be exposed and unexposed, respectively, by the activating radiation. The exposure wavelength is typically sub-500 nm, such as from 200 to 500 nm of UV-visible light. Preferably, the exposure is conducted with radiation of 365 nm wavelength from a mercury lamp (i-line).

Following exposure of the photoresist composition layer, a post exposure bake (PEB) is typically performed to decompose the acid labile group by acid that generated from the PAG during the exposure step. The PEB can be conducted, for example, on a hotplate or in an oven. A latent image defined by the boundary between polarity-switched and unswitched regions (corresponding to exposed and unexposed regions, respectively) is thereby formed.

The photoresist composition layer is next contacted with an alkaline developing solution to remove exposed portions of the layer, leaving unexposed regions forming a resist pattern. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH).

A further aspect of the invention is a process for depositing a metal on a metal layer. The process includes: (i) forming a photoresist composition layer on a metal layer; (ii) patternwise exposing the photoresist composition layer to activating radiation; (iii) a post exposure bake step to decompose the acid labile group; (iv) contacting the photoresist composition layer with an alkaline developing solution to remove exposed portions of the photoresist composition layer; and (v) immersing the metal layer in a metal plating solution and electro depositing a metal on the metal layer in the exposed portions of the photoresist composition layer. The metal layer is typically formed on a substrate.

The metal layer can be made, for example, of copper, silver, aluminum, gold or an alloy thereof. The metal layer may also be referred to herein as the first metal layer. When the metal layer is formed on a substrate, the metal layer can be formed using known methods, for example, by chemical vapor deposition (CVD) or physical vapor deposition (PVD) techniques, with sputtering and plating being typical. The thickness of the metal layer is typically from 10 nm to 1000 nm. Examples of the substrate include, but are not limited to, silicon wafers, glass substrates and plastic substrates, such substrates optionally including one or more layers or features formed thereon.

The photoresist composition layer is formed from the photoresist composition as described herein, comprising: a first polymer, a second polymer, an optional quencher, a photoacid generator and a solvent. The photoresist composition is applied on the metal layer by a known method, such as spin-coating, roll coating or screen printing. To form a thick photoresist composition layer, a high solids content and/or high viscosity photoresist composition is typically desired. The solid content of the composition is typically from 10 to 60 wt %, preferably from 20 to 50 wt %, based on the total weight of the photoresist composition. By using such a composition, a thick layer, for example, of 50 nanometers to 50 micrometers, preferably 0.8 micrometer to 30 micrometers, and more preferably 1.2 micrometers to 10 micrometers, can be formed.

After applying the photoresist composition, soft baking can be conducted to minimize the solvent content in the layer and to improve adhesion of the layer to the substrate. The photoresist composition layer is then exposed through a mask having a predefined pattern using radiation such as ultraviolet light having a wavelength of from 200 to 500 nanometers (nm) of UV-visible light. Preferably, the exposure is conducted with radiation of 365 nm wavelength (i-line).

The photoresist composition layer is contacted with an alkaline developing solution to develop the exposed portions of the photoresist composition layer. Examples of the alkaline developing solution include aqueous solutions of tetramethyl ammonium hydroxide, sodium hydroxide and potassium hydroxide. The exposed portions can form a pattern such as a hole (e.g., contact, via or bump pattern) or trench (e.g., line-space) pattern. Such patterns preferably have a high aspect ratio. As used herein, aspect ratio (AR) is defined as AR=h/d, wherein h is the photoresist height (i.e., thickness) and d is the spacing in the pattern, for example, hole diameter (e.g., for contact, via or bump patterns) or length of space between adjacent lines (e.g., for trench patterns). Typically, the hole diameter can be from 2 to 200 micrometers, preferably from 10 to 50 micrometers. The aspect ratio is typically 0.1 or more, 0.2 or more, from 0.1 to 10.0, or from 0.2 to 7.0.

The substrate can next be immersed in a metal plating solution to plate metal on the exposed first metal layer in those regions in which the photoresist composition layer has been developed away. The developed regions of the photoresist composition layer function as a mold for the metal plating. The metal can be plated, for example, by electroplating. Various types of metal plating solutions known in the art can be used. Also, two or more different layers of metal can be formed, and the layers can be of the same or different metals. Preferable plated metals include, but are not limited to, copper, nickel, tin, silver, gold and mixtures and alloys thereof. Suitable metal plating solutions for use in forming such metals are known in the art and are commercially available from DuPont Electronic and Imaging. The thickness of the plated metal layer is typically from 1 to 100 micrometers, preferably from 20 to 50 micrometers. The plated metal layer thickness can be less than or exceed the thickness of the photoresist layer.

After metal plating, the remaining photoresist composition layer can be removed (stripped) from the substrate. Suitable photoresist strippers are commercially available, for example, Shipley BPR™ Photostripper (DuPont Electronic and Imaging).

The exposed first metal layer between the plated metal structures can be removed, for example, by etch-back process, to electrically isolate each of the plated metal structures. The obtained metal structures can have, for example, a pillar shape, which can be useful for a metal bump for providing electrical connection between two components. Advantageously, metal pillars having small-diameter and straight (vertical) sidewalls can be formed by compositions and methods disclosed herein. Such structures find use, for example, in electrical connections in small, light and thin devices. The width (diameter) of the pillars can, for example, be from 5 to 200 micrometers, preferably from 10 to 50 micrometers. The height of the pillars will depend, for example, on the thickness of the photoresist composition resin, but pillar heights of 20 micrometers or more can be formed.

This invention is advantageous in that the photoresist composition may be used for metal plating. It may also be used in dry etching processes to remove an underlayer (e.g., a metal, an oxide or a nitride, and so on) in processes where a photoresist pattern is not always used.

Another aspect of the invention is a process for etching a metal, silicon (and/or its oxide or nitride), or a combination thereof. The process includes: (i) forming a photoresist composition layer on the metal, silicon (and/or its oxide or nitride), or a combination thereof (ii) patternwise exposing the photoresist composition layer to activating radiation; (iii) a post exposure baking to decompose an acid labile group; (iv) contacting the photoresist composition layer with an alkaline developing solution to remove exposed portions of the photoresist composition layer; and (v) etching metal, silicon (and/or its oxide or nitride), or a combination thereof, where the photoresist was removed on the prior step. Dry plasma or wet etching methods are typically used.

Then photoresist layer is then formed as describe above. If the photoresist layer is formed on a non-metallic surface, then the first quencher may not be used, since it will prevent pattern footing caused by the metallic surface. Pattern footing describes ease of ionization and ease of migration of the ionized metal.

The invention will now be exemplified by the following non-limiting examples.

EXAMPLES

Example 1

This example details the absorption characteristics of the photoresist composition that contains the first polymer and the second polymer. The first polymer comprises the first polymerized units of a first vinyl aromatic monomer, second polymerized units of a first ethylenically unsaturated double bond having a pendent acid-labile group; and third polymerized units of an ethylenically unsaturated double bond having a substituted or unsubstituted aromatic group having three fused aromatic rings. Because of the presence of the fused aromatic rings, the first polymer has also been referred to herein as a polymeric dye. The components of the photoresist composition are shown below.

The first polymer (also referred to as polymeric dye A) comprises

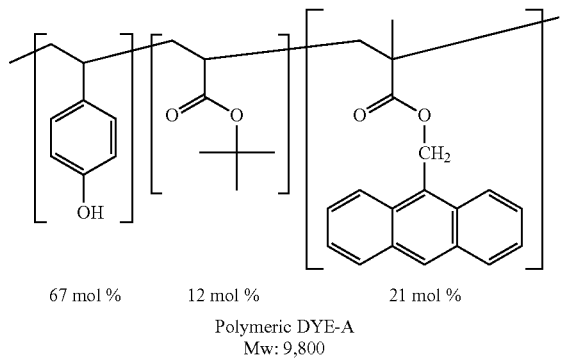

67 mol %  12 mol %  21 mol %
Polymeric DYE-A
Mw: 9,800

The second polymer which comprises a copolymer of polyhydroxystyrene and polytetiarybutylmethacrylate (denoted as (PHS/TBA) is shown below.

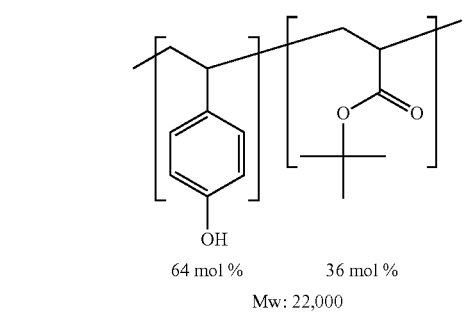

64 mol %  36 mol %
Mw: 22,000

Photoacid generator

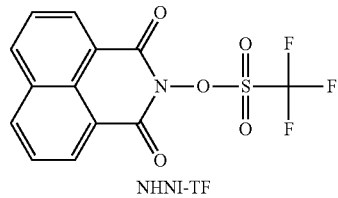

NHNI-TF

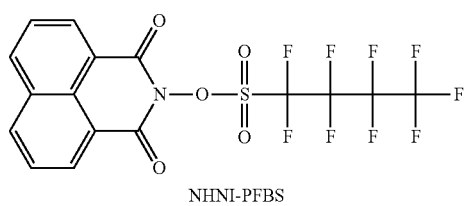

NHNI-PFBS

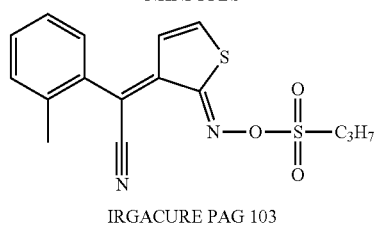

IRGACURE PAG 103

Quencher

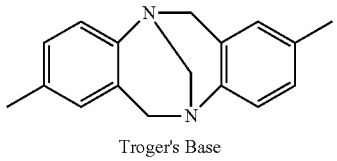

Troger's Base

The composition of photoresist is described as parts by weight. The solvent is a mixture of propylene glycol methyl ether acetate (PGMEA) and gamma-butyrolactone (GBL). The solvent is present in an amount of 71.5 parts by weight. The propylene glycol methyl ether acetate and gamma-butyrolactone are used in a 95:5 weight ratio.

Anthracene act as dye to absorb incident light having i-line wavelengths (365 nm). Anthracene undergoes strong sublimation when subjected to elevated temperatures during pre-bake steps prior to exposure. To prevent sublimation, the anthracene chromophore is attached to side chain of an acrylic repeat unit. This anthracene containing polymer is termed ANTMA (anthracene methacrylate). ANTMA has a unique UV spectrum between 320 to 420 nm. There is a strong UV absorbance around i-line wavelengths. UV absorption anthracene of g (436 nm) and h (405 nm) is weaker than that of i-line. J-line (334 nm) may be absorbed by ANTMA. A 330 nm cut high pass filter was used for lithographic test.

The photoresist composition containing the first polymer, the second polymer, a quencher, a photoacid generator and a solvent were first coated on a silicon substrate primed with hexamethyldisilazane (HMDS).

Figure 3:
FIG. 3 depicts Table 1.
Figure 3:
Figure 3:
Figure 3:

Table 1 in FIG. 3 shows the photoresist compositions for the sample, while Table 2 shows the application and exposure conditions. The structures for the various ingredients used in the photoresist compositions are shown below.

TABLE 2

| | |
|---|---|
| Substrate | Silicon |
| Primer | HMDS (hexamethyldisilizane) |
| Pre-Bake | 90° C. for 60 seconds |
| Film thickness | 5 micrometers (μm) |
| Exposure | ghi-broad band < 330 nm cut. MA-1200 |
| Mask | Multi Tone mask |
| P.E.B | 110° C./60 sec |
| Developer | MF ® CD-26, Paddle, 60 sec (2.38 wt % TMAH) |

From the data in Table 1 it may be seen that absorbance (by the photoresist) at i-line wavelength (365 nm) is increased as the amount of polymeric dye (first polymer) loading is increased. Dark erosion was reduced by the addition of the polymeric dye. Dark erosion is the non-zero dissolution of the resist in unexposed areas in the developer. Sensitivity however, is improved. The overhung pattern profile was also improved by controlling absorbance.

FIG. 1A is a graph that depicts film loss (dark erosion) in unexposed regions of the film while FIG. 1B is a graph that depicts sensitivity ($E_{op}$) shift as a function of polymeric dye (first polymer) loading. CD stands for critical dimension and is measured via pattern size. $E_{th}$ stands for the minimum exposure energy to break through the film during specified development conditions. $E_{op}$, stands for the optimum exposure energy to give a desired pattern size. A pattern size of 15 μm was targeted for this experiment. In the FIG. 1A, UFTL represents unexposed area of film thickness loss (film thickness loss in the unexposed area).

Example 2

This example was conducted evaluate a photoresist composition that comprises a polymeric dye (the first polymer) when subjected to narrow band i-line exposure. The ingredients used in the photoresist composition are shown in the FIG. 4 (Table 3). The structures for the second polymer and the quencher are shown below. The solvents used were propylene glycol methyl ether acetate PGMEA) and gamma-butyrolactone (GBL) in a weight ratio 95:5. The first polymer is the same as that used in Example 1.

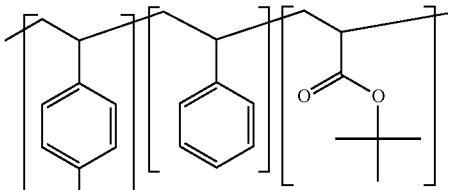

All weights in the Table 3 are in parts per hundred based on the weight of the solids in the photoresist composition. Table 4 below shows the test conditions for the photoresist composition when coated onto a substrate.

TABLE 4

| Process | Conditions |
|---|---|
| Substrate; | 150 mm silicon substrate |
| Coater | SK-W60A-AVP, SCREEN |
| Primer | 120° C./35 sec, HMDS Vapor |
| Resist FT | 10 μm |
| Pre-Bake | 135° C./90 seconds |
| Exposure | NSR 2005-i9C, 0.50 NA, 0.68 PC |
| Mask | 2.4 μm 1:2 Circular Contact hole |
| Develop and PEB | Clean Track Mk-Vz, Tokyo Electron Co., |
| PEB (post exposure bake) | 110° C./90 sec |
| Development | Straight nozzle, 80 sec, MF ® CD-26 |
| Hard Bake | 110° C./90 sec, SK-W60A-AVP |
| CDSEM; | HITACHI S9200, |

Figure 2:
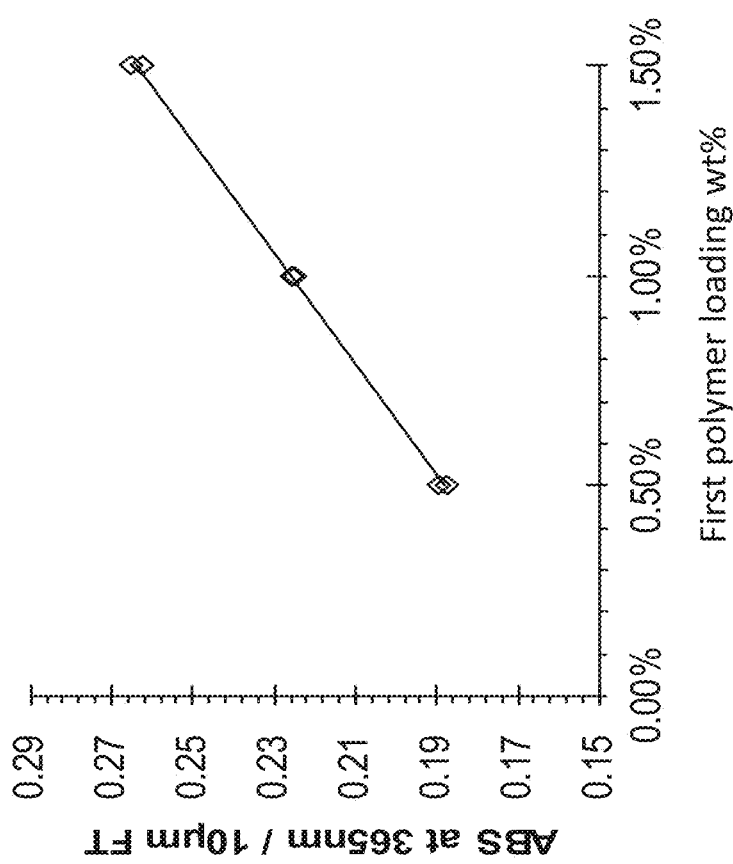
FIG. 2 is a graph that shows that the addition of the first polymer (containing the anthracene substituent) increases absorbance (Abs) of the photoresist at i-line wavelengths (365 nm)

From the Table 3 it may be seen that higher polymeric dye (the first polymer) loading gives higher sensitivity (lower exposure energy to clear the thickness [Eth] and to give target pattern size [Eop]). Without being limited to theory, the addition of the first polymer to the photoresist composition affects sensitivity by its absorption abilities. FIG. 2 is a graph that shows that the addition of the first polymer (containing the anthracene substituent) increases absorbance of the photoresist at i-line wavelengths (365 nm).

The use of a lower weight average molecular weight for the first polymer ($M_w$=8900 g/mole) than for the second polymer ($M_w$=15,500 g/mole) was believed to produce a larger amount of dark erosion, but this did not occur. The addition of the first polymer also produces a lower film loss (dark erosion) which allows the photoresist composition have a lower dissolution rate.

At increased loadings of the first polymer in the photoresist composition the sidewall angle is reduced over comparative photoresist compositions that do not contain the anthracene substituent in the polymer. The effect of base quencher ratio of tBOC-4HP to Troger's base was weak and showed no significant effect on properties.

Example 3

This example was conducted to determine the effect of the first polymer (that contains the anthracene pendent group) on the sensitivity and overhung pattern profile improvement. The PAG used is NHNI-PFBS, the first polymer is polymeric DYE-A shown below and the second polymer is one of polymer B, polymer C or polymer E, the structures of which are shown below.

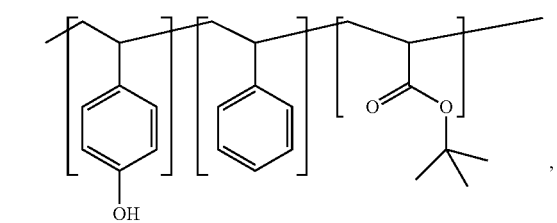

65/20/15 mol%
Polymer-B
Mw: 17,000

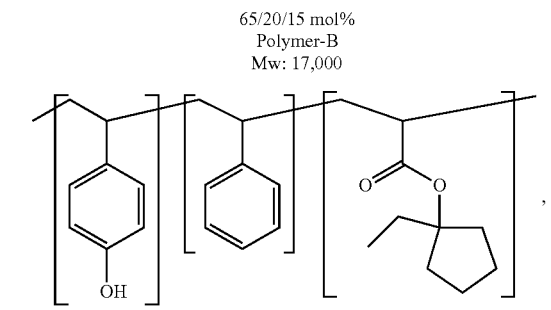

70/9/21 mol%
Polymer-C
Mw = 12,00

-continued

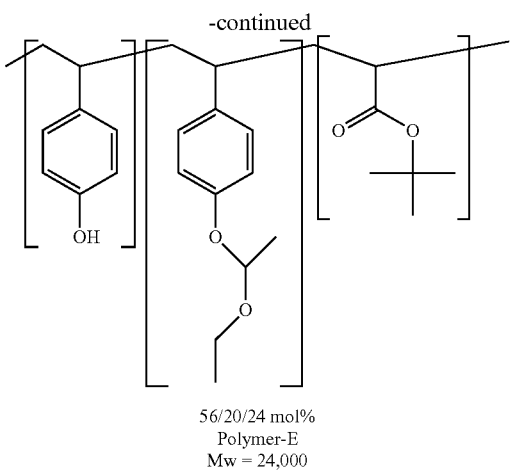

56/20/24 mol%
Polymer-E
Mw = 24,000 is shown as Polymeric DYE—A (below) having a weight average molecular weight of 9,800 g/mole.

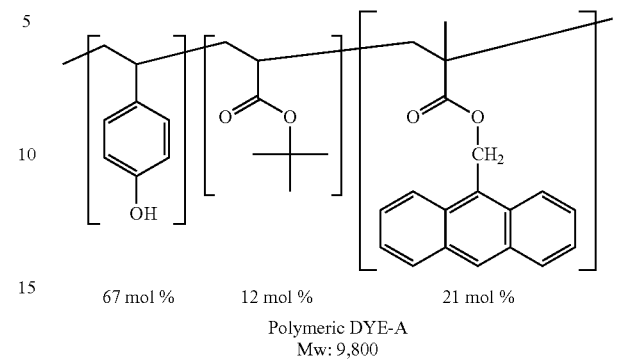

67 mol %   12 mol %   21 mol %
Polymeric DYE-A
Mw: 9,800

The mole percents for each repeat unit in the respective second polymers are shown above. The photoresist compositions are shown in the Tables 5, 6 and 7. The first polymer is shown as Polymeric DYE—A (below) having a weight average molecular weight of 9,800 g/mole.

Table 5 details the photoresist compositions, while Tables 6 (FIGS. 5) and 7 (FIG. 6) detail the photoresist compositions along with some of the results.

TABLE 5

| Material | Chemical | Sample #10 | Sample #11 | Sample #12 | Sample #13 | Sample #14 | Sample #15 | Sample #16 | Sample #17 |
|---|---|---|---|---|---|---|---|---|---|
| Polymer | Second polymer Polymer-B Polymer-C Polymer-E | 100 | 100 | 100 | 100 | 100 | 100 | 100 | 100 |
| PAG | NHNI-TF | — | — | 1.0 | 1.0 | 1.0 | 1.0 | 1.0 | 1.0 |
|  | NHNI-PFBS | 1.43 | 1.43 | — | — |  |  |  |  |
| Base Quencher | Troger's Base | 0.10 | 0.10 | 0.10 | 0.10 | 0.10 | 0.10 | 0.10 | 0.10 |
| DYE | First polymer Polymeric DYE-A Mw = 8900 g/mole | — | 1.5 | — | — |  | 1.5 |  | 1.5 |
| SLA | SLA*-A | 0.03 | 0.03 | 0.03 | 0.03 | 0.03 | 0.03 | 0.03 | 0.03 |
| Solid Content [wt %] |  | 33.7 | 33.7 | 33.7 | 33.7 | 33.7 | 33.7 | 33.7 | 33.7 |
| Solvent | PGMEA/GBL wt % | 95/5 | 95/5 | 95/5 | 95/5 | 95/5 | 95/5 | 95/5 | 95/5 |

*SLA = surface levelling agent

From the Tables 6 and 7 (See FIGS. 5 and 6 respectively), it may be seen that the first polymer containing the anthracene pendent group imparts higher sensitivity to the photoresist composition. The photoresist compositions can work with i-line radiation (365 nm) even when a PAG other than NHNI-TF is used. Sidewall angle improvement (lower number of side wall angle) is observed when the 1st polymer is formulated as may be seen in Tables 6 and 7.

Example 4

This example demonstrates the effect of using a photoresist composition that comprises an acetal protected polyhydroxystyrene as the acid labile polymer. The photoresist composition also comprises the first polymer (the polymeric dye) detailed above. Table 9 details the photoresist composition. The second polymer comprises the acetal protected polyhydroxystyrene as the acid labile polymer and is shown below as Polymer F and has a weight average molecular weight of 22,000 grams per mole.

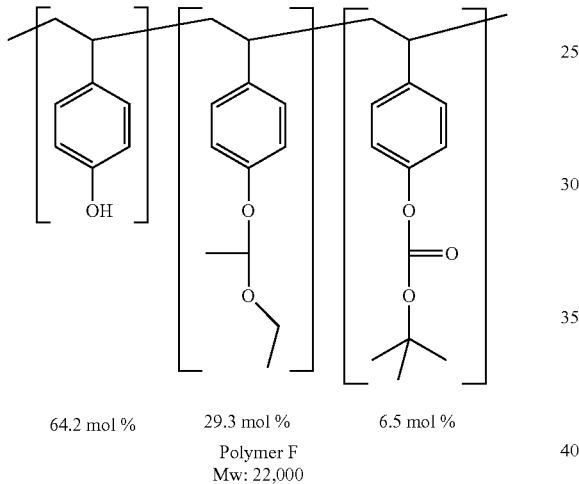

64.2 mol %   29.3 mol %   6.5 mol %

Polymer F
Mw: 22,000

Table 9 shows the process conditions while Table 10 (See FIG. 7) shows various photoresist compositions that contain the first polymer (Polymeric Dye A) and the second polymer (Polymer F). All weights in Table 10 (See FIG. 7) are based on parts by weight based on total solid content.

TABLE 9

| Process | Conditions |
| --- | --- |
| Substrate; | 150 mm Si |
| Coater | SK-W60A-AVP, SCREEN (Previously SOKUDO) |
| Primer | 120° C./35 sec, HMDS Vapor |
| Resist FT | 10 μm |
| Pre-Bake | 90° C./90 seconds |
| Exposure | NSR 2005-i9C, 0.50 NA, 0.68 PC |
| Mask | 2.4 μm 1:2 Circular Contact hole |
| Develop and PEB | SK-W60A-AVP, SCREEN (Previously SOKUDO) |
| PEB | 110° C./90 seconds |
| Development | 100 sec, MF ® CD-26 |
| Hard Bake; | 110° C./90 sec, SK-W60A-AVP |
| CDSEM; | HITACHI S9200, |

Higher sensitivity and sidewall angle improvement were obtained by using a photoresist composition that comprises the first polymer (that comprises a polymeric die) and the second polymer (an acetal protected polyhydroxystyrene).

What is claimed is:

1. A pattern formation method, comprising:
   (a) applying a layer of a photoresist composition over a substrate,
   (b) pattern-wise exposing the photoresist composition layer to i-line radiation; and
   (c) developing the exposed photoresist composition layer to provide a resist relief image; wherein the layer of the photoresist composition is coated in a single application by spin-coating to a thickness of 1 to 50 micrometers;
wherein the photoresist composition comprises:
   a non-ionic photoacid generator;
   a solvent;
   a first polymer comprising first polymerized units of formula (1), second polymerized units of formula (2); and third polymerized units of formula (3):

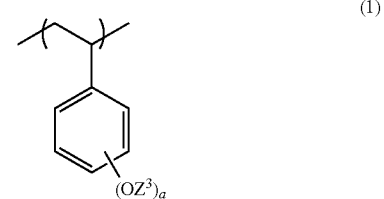

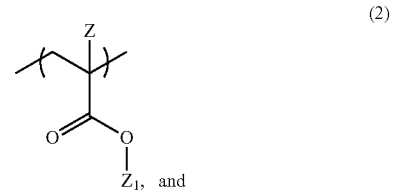

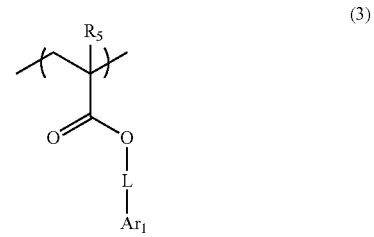

wherein a is an integer from 1 to 5 and $Z^3$ is a hydrogen, Z and R5 are independently selected from a hydrogen atom, $C_1$-$C_4$ alkyl, $C_1$-$C_4$ fluoroalkyl, or cyano; Zi is a non-hydrogen substituent comprising an acid-labile group, the cleavage of which forms a carboxylic acid on the polymer; L is a substituted or unsubstituted $C_1$-$C_4$ alkylene; $Ar_1$ is a substituted or unsubstituted anthracene group; wherein the first polymer is present in the photoresist composition in an amount of from 0.1 to 10 wt %, based on total solids of the photoresist composition; and
   a second polymer comprising first polymerized units of formula (4)

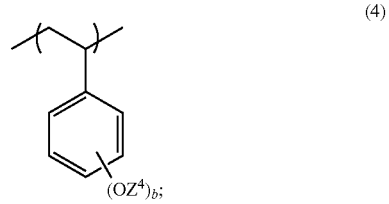

wherein b is an integer from 1 to 5 and $Z^4$ is a hydrogen or an alkyl group having 1 to 5 carbon atoms; and second polymerized units of a monomer comprising an acid-labile group; and wherein the second polymer is free of polymerized units of formula (3): present in the photoresist composition in an amount of 10 to 99 wt %, based on total solids of the photoresist composition.

2. The method of claim 1, wherein the acid-labile group of the second polymerized unit of formula (2) is a tertiary ester group or an acetal group.

3. The method of claim 1, wherein the third polymerized units of the first polymer are represented by formula (3a)

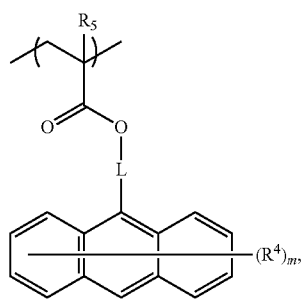
(3a)

wherein each $R^4$ is selected from a hydrogen, a halogen, a substituted or unsubstituted alkyl having 1 to about 12 carbon atoms; a substituted or unsubstituted alkoxy having 1 to about 12 carbon atoms; a substituted or unsubstituted alkenyl having 2 to about 12 carbon atoms; a substituted or unsubstituted alkynyl having 2 to about 12 carbon atoms; a substituted or unsubstituted alkylthio having 1 to about 12 carbon atoms; a cyano; a nitro; an amino; or a hydroxyl; m is an integer of from 0 to 9 and wherein $R_5$ is selected from a hydrogen atom, $C_1$-$C_4$ alkyl, $C_1$-$C_4$ fluoroalkyl and a cyano group; and wherein L is a substituted or unsubstituted C1-C4 alkylene.

4. The method of claim 3, wherein the first polymerized unit of formula (1) comprises polyhydroxystyrene and wherein the second polymerized unit of formula (2) comprises a tertiary alkyl ester.

5. The method of claim 1, where the second polymer has a higher average molecular weight than the first polymer and wherein the second polymer has a weight average molecular weight of 5,000 g/mole to 50,000 g/mole.

6. The method of claim 1, where the first polymer comprises polyhydroxystyrene, a polymer derived from an ethylenically unsaturated acrylic ester that has an acid labile group and a polymer having the structure:

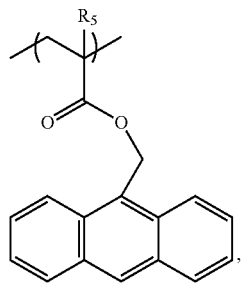

wherein $R^5$ is hydrogen.

7. The method of claim 1, where the first polymer has the structure of formula (4)

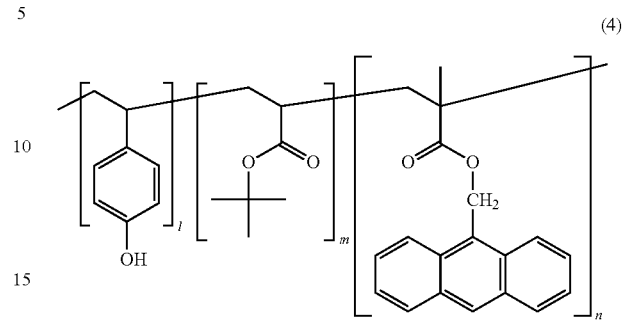
(4)

wherein l is 40 to 75 mol %, m is 8 to 16 mol % and n is 5 to 30 mol %, based on total moles of the copolymer; and wherein the weight average molecular weight of the first polymer is 5,000 to 15,000 grams per mole.

8. The method of claim 1, wherein the second polymer is a copolymer having the structure of formula (8), (9), (10), (11) or (12)

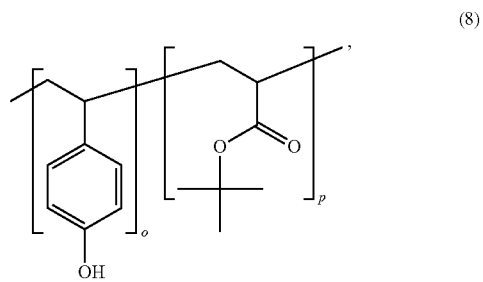
(8)

wherein in formula (8) o is 40 to 90 mol % and p is 10 to 60 mol %;

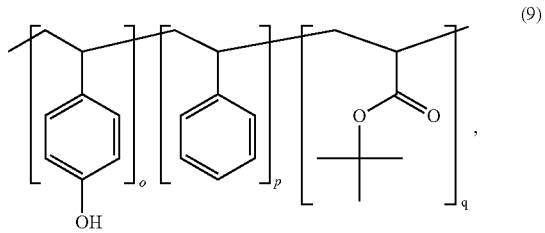
(9)

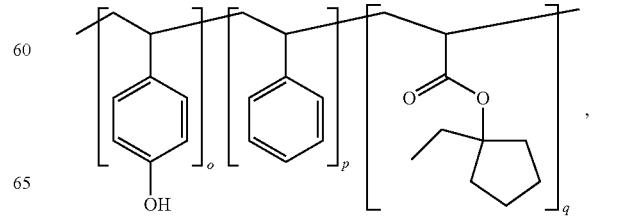
(10)

-continued (11)

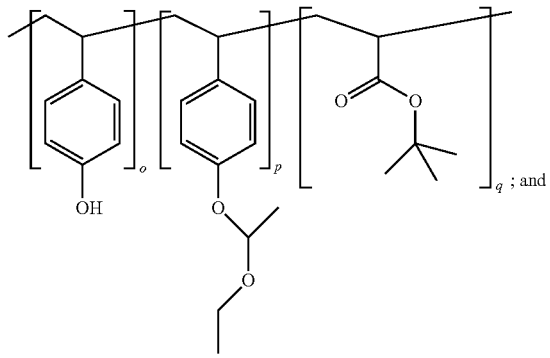

(12)

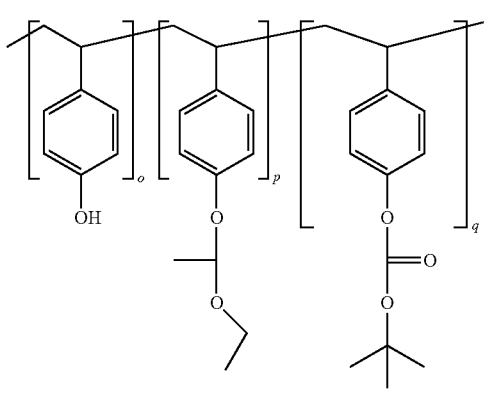

wherein in formulas (9) through (12), o is 50 to 85 mol %, p is 5 to 30 mol %, and q is 10 to 25 mol %; and wherein all mole percentages are based on the total molar content of the second polymer.

9. The photoresist composition of claim 1, where the photoacid generator has the structure shown in formula (13)

(13)

wherein in formula (13), $R^4$ is a substituted or unsubstituted, linear or branched Ci to C14 alkyl group, a substituted heterocyclic group, or a halogen atom; and wherein $R^5$ is a substituted or unsubstituted alkyl group having 1 to 18 carbon atoms; a halogen atom, or an aryl group having 6 to 20 unsubstituted carbon atoms; and x is an integer from 0 to 6.

10. The method of claim 1, wherein the photoresist composition further comprises a base quencher and wherein the base quencher is selected from N,N-diethyldodecanamide, 2,8-dimethyl-6H,12H-5,11-methanodibenzo[b,f][1,5]diazocine and 1,1-dimethylethyl 4-hydroxypiperidine-l-carboxylate.

11. The method of claim 1, wherein the acid-labile group of the second polymer is a tertiary alkyl ester group or an acetal group.

12. The method of claim 1, wherein the acid-labile group containing monomer of the second polymer has the structure of formula (7)

(7)

wherein in formula (7), $R^b$ is hydrogen, fluorine, a substituted or unsubstituted $C_{1-5}$ alkyl, or a substituted or unsubstituted $C_{1-5}$ fluoroalkyl; each A is independently a halogen, a hydroxy, a carboxylic acid or ester, a thiol, a straight chain or branched $C_{1-20}$ alkyl, a monocyclic or polycyclic $C_{3-20}$ cycloalkyl, a monocyclic or polycyclic $C_{3-20}$ fluorocycloalkenyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted; and m is independently an integer of 0 to 4;

wherein in formula (7), $R^{11}$, $R^{10}$, and $R^8$ are each independently hydrogen, a straight chain or branched $C_{1-20}$ alkyl, a straight chain or branched $C_{1-20}$ heteroalkyl, a monocyclic or polycyclic $C_{3-20}$ cycloalkyl, a monocyclic or polycyclic $C_{3-20}$ heterocycloalkyl, a monocyclic or polycyclic $C_{6-20}$ aryl, a $C_{7-20}$ aryloxyalkyl, or a monocyclic or polycyclic $C_{4-20}$ heteroaryl, each of which is substituted or unsubstituted and wherein any two of $R^{11}$, $R^{10}$, and $R^8$ together optionally may form a ring;

wherein in formula (7), $R^7$ is hydrogen, a substituted or unsubstituted straight chain or branched $C_{1-20}$ alkyl, a substituted or unsubstituted monocyclic or polycyclic $C_{3-20}$ cycloalkyl, a substituted or unsubstituted monocyclic or polycyclic $C_{3-20}$ heterocycloalkyl, a substituted or unsubstituted $C_{6-14}$ aryl, a substituted or unsubstituted $C_{3-14}$ heteroaryl, a substituted or unsubstituted $C_{7-18}$ arylalkyl, a substituted or unsubstituted $C_{4-18}$ heteroarylalkyl, or a substituted or unsubstituted $C_{1-12}$ heteroalkyl; and wherein in formula (7), $R^9$ is hydrogen, a substituted or unsubstituted straight chain or branched $C_{1-20}$ alkyl, a substituted or unsubstituted monocyclic or polycyclic $C_{3-20}$ cycloalkyl, a substituted or unsubstituted monocyclic or polycyclic $C_{3-20}$ heterocycloalkyl, a substituted or unsubstituted $C_{6-14}$ aryl, a substituted or unsubstituted $C_{3-14}$ heteroaryl, a substituted or unsubstituted $C_{7-18}$ arylalkyl, a substituted or unsubstituted $C_{4-18}$ heteroarylalkyl, or a substituted or unsubstituted $C_{1-12}$ heteroalkyl; and wherein $R^7$ and $R^9$ can join together to form a ring, and any one of $R^7$, $R^9$ can join together with any of $R^8$, $R^{10}$ or $R^{11}$ to form a ring.

13. The method of claim 10, wherein the acid-labile group of the second polymer is a tertiary alkyl ester, the second polymer further comprising third polymerized units of a monomer comprising an acetal group.

14. The method of claim 1, wherein the solvent is an organic-based solvent and wherein the substrate comprises a metal layer.

15. The method of claim 14, wherein the layer of the photoresist composition is disposed on the metal layer and further comprises immersing the metal layer in a metal plating solution and depositing a metal on the metal layer in the exposed portions of the photoresist composition.

\* \* \* \* \*